United States Patent
Xiao et al.

(10) Patent No.: US 7,061,421 B1
(45) Date of Patent: Jun. 13, 2006

(54) FLASH ADC WITH VARIABLE LSB

(75) Inventors: Jinwen Xiao, Austin, TX (US); Ka Y. Leung, Austin, TX (US); Douglas R. Holberg, Wimberley, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/096,163

(22) Filed: Mar. 31, 2005

(51) Int. Cl.
*H03M 1/78* (2006.01)

(52) U.S. Cl. .................................. 341/155; 341/159

(58) Field of Classification Search ................ 341/154, 341/155, 156, 158, 159
See application file for complete search history.

(56) References Cited

U.S. PATENT DOCUMENTS

| | | | | |
|---|---|---|---|---|
| 4,578,715 | A | * | 3/1986 | Yamaguchi ............... 358/3.01 |
| 4,630,187 | A | | 12/1986 | Henze |
| 5,231,399 | A | * | 7/1993 | Gorman et al. ............. 341/159 |
| 5,731,776 | A | * | 3/1998 | Kumamoto et al. ........ 341/159 |
| 6,084,538 | A | * | 7/2000 | Kostelnik et al. .......... 341/120 |
| 6,114,982 | A | * | 9/2000 | Hardy et al. ................ 341/159 |
| 6,600,439 | B1 | * | 7/2003 | Pahr .......................... 341/158 |
| 6,617,991 | B1 | * | 9/2003 | Kaul et al. .................. 341/155 |
| 2003/0043066 | A1 | * | 3/2003 | Otsuka et al. ............. 341/158 |
| 2003/0231051 | A1 | * | 12/2003 | Vorenkamp ................ 327/540 |
| 2004/0095122 | A1 | | 5/2004 | Chapuis |
| 2004/0155637 | A1 | | 8/2004 | Chapuis |
| 2004/0196014 | A1 | | 10/2004 | Chapuis |

OTHER PUBLICATIONS

Aleksandar Prodic, et al.; Mixed-Signal Simulation of Digitally Controlled Switching Converters; Colorado Power Electronics Center, Department of Electrical and Computer Engineering, University of Colorado at Boulder; Boulder, CO 80309-0425, USA, no date/month.
Patella, B.J. et al.; High-Frequency Digital PWM Controller IC for DC-CD Converters; Power Electronics, IEEE, vol. 18, Issue 1; pp. 438-446; Jan. 2003.
Albert M. Wu, et al.; Digital PWM Control: Application in Voltage Regulation Modules; Department of Electrrical Engineering and Computer Sciences, University of California, Berkeley; IEEE 1999, no month/date.

(Continued)

*Primary Examiner*—Linh V. Nguyen
(74) *Attorney, Agent, or Firm*—Howison & Arnott, L.L.P.

(57) ABSTRACT

A differential analog-to-digital data converter (ADC) is disclosed for receiving a positive input signal and a negative input signal. A distributed resistive device is provided having taps associated therewith. A plurality of comparators each having a signal input and a reference input are provided, the signal input connected to one of the positive and negative input signals and the reference input connected to a tap on said distributed resistive device. A driver drives current through the distributed resistive device with one of the taps of the distributed resistive device disposed at substantially the other of the positive and negative input signals. A current varying device varys the current through the distributed resistive device to vary the voltage between taps.

17 Claims, 8 Drawing Sheets

OTHER PUBLICATIONS

F. Baronti, et al.; DC/DC Switching Power Converter with Radiation Hardened Digital Control Based on SRAM FPGAs; P/MAPLD 2004, no date/month/year.

Angel V. Peterchev, et al.; Quantization Resolution and Limit Cycling in Digitally Controlled PWM Converters; Department of Electrical Engineering and Computer Science, University of California, Berkeley; no date/month/year.

Biranchinath Sahu, et al.; Adaptive Power Management of Linear RF Power Amplifiers in Mobile Handsets: An Integrated System Design Approach; Georgia Tech Analog and Power IC Design Laboratory, School of Electrical and Computer Engineering, Georgia Institute of Technology; Submission for IEEE Asia Pacific 2004, no date/month.

Aleksandar Prodic, et al.; Design of a Digital PID Regulator Based on Look-Up Tables for Control of High-Frequency DC-DC Converters; Colorado Power Electronics Center, Department of Electrixcal and Computer Engineering, University of Colorado; Boulder, CO 80309; 0425, USA, no date/month/year.

John Sustersic, et al.; Design and Implementation of a Digital Controller for DC-to-DC Power Converters; NASA Clen Research Center, Robert Button; The Advanced Engineering Research Laboratory, Cleveland State University. Copyright 2000 Society of Automotive Engineers, Inc, no date/month.

Gu-Yeon Wei, et al; A Fully Digital, Energy-Efficient, Adaptive Power-Supply Regulator; IEEE Journal of Solid State Circuits, vol. 34, No. 4, Apr. 1999.

Dragan Maksimovic, et al.; Custom IC Blocks for Enabling Digital Control in Switching Power Converters; Colorado Power Electronics Center, University of Colorado, Boulder, Jul. 11, 2003.

LM2636 5-Bit Programmable Synchronous Buck Regulator Controller, National Semiconductor, Mar. 2005; 2005 National Semiconductor Corporation.

Jinwen Xiao, et al.; An Ultra-Low-Power Digitally-Controlled Buck Converter IC for Cellular Phone Applications; University of California, Berkeley; IEEE 2004, no date/month.

Jinwen Xiao, et al.; Architecture and IC Implementation of a Digital VRM Controller, Department of Electrical Engineering and Computer Science, University of California, Berkeley; IEEE 2001, no date/month.

* cited by examiner

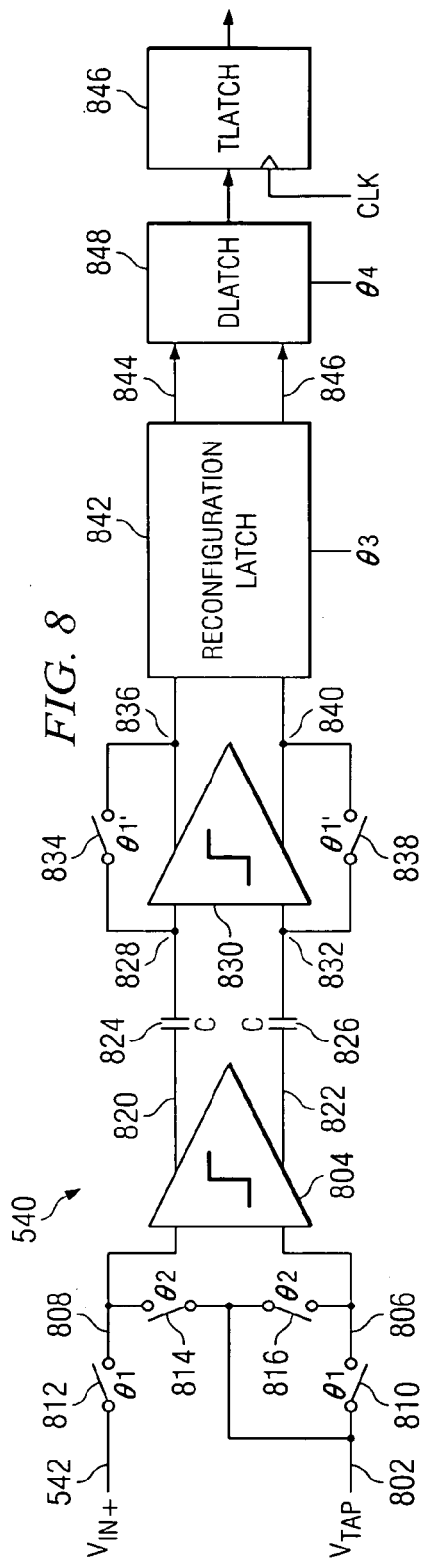
*FIG. 8*
*FIG. 8a*
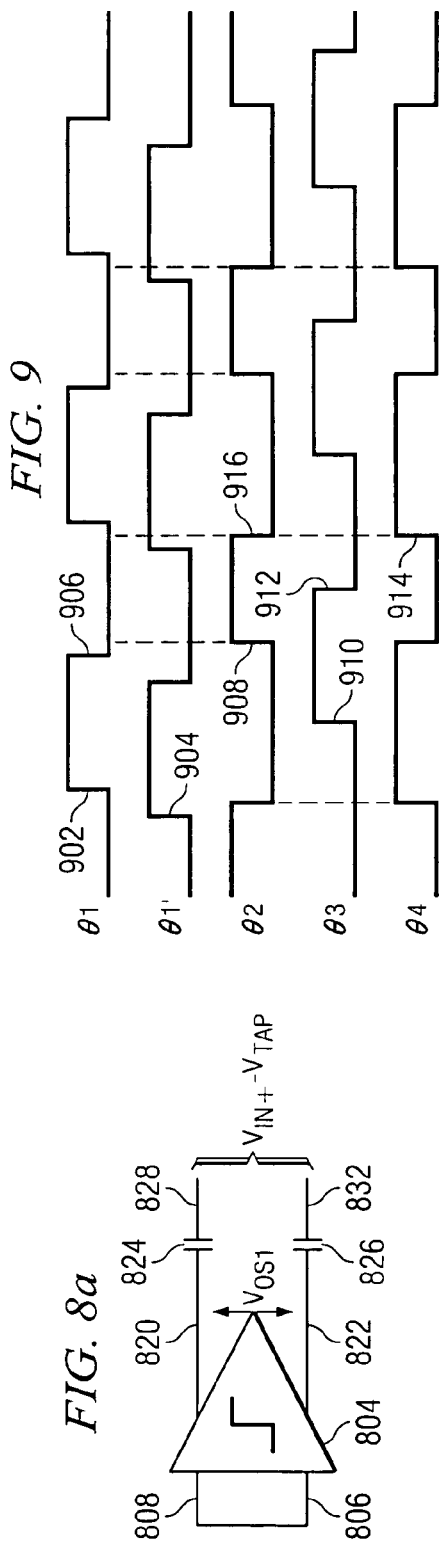
*FIG. 9*

FLASH ADC WITH VARIABLE LSB

This application is related to U.S. patent application Ser. No. 11/095,844, filed date herewith, and entitled "DIGITAL PULSE WIDTH MODULATED POWER SUPPLY VARIABLE LSB" and U.S. patent application Ser. No. 11/096,597, filed of even date herewith, and entitled "DIGITAL PWM CONTROLLER", both of which are incorporated herein by reference in their entirety.

TECHNICAL FIELD OF THE INVENTION

The present invention pertains in general to data converters and, more particularly, to analog-to-digital converters (ADCs) of the Flash type.

BACKGROUND OF THE INVENTION

There are various types of ADC architectures, one of which is the Flash ADC. These are sometimes known as parallel ADCs. They are considered the fastest way to convert an analog signal to a digital signal. They are suitable for applications requiring very large bandwidths. However, Flash converters consume a lot of power, have relatively low resolution, and can be quite expensive. This limits them to high frequency applications that typically cannot be addressed any other way. Examples of conventional use of Flash ADCs include data acquisition, satellite communication, radar processing, sampling oscilloscopes, and high-density disc drives.

A typical ADC includes a plurality of comparators, there being $2^N-1$ comparators. A resistive divider with $2^N$ resistors provides the reference voltage. The reference voltage for each comparator is at least one least significant bit (LSB) greater than the reference voltage for the comparator immediately below it. Each comparator produces a "1" when its analog input voltage is higher than the reference voltage applied to it. Otherwise, the comparator output is "0." Thus, if the analog input is between the threshold voltage associated with two adjacent comparators, then the lowest most one of those comparators will output a "1" and all of the lower comparators will also output "1." The point where the code changes from ones to zeros is the point where the input signal becomes smaller than the respective comparator reference voltage levels. This is known as thermometer code encoding, so named because it is similar to a mercury thermometer, where the mercury column always rises to the appropriate temperature and no mercury is present above that temperature. The thermometer code is then decoded to the appropriate digital output code.

The comparators utilized in the Flash ADC are typically a cascade of wideband low gain stages. They are low gain because of high frequencies. It is difficult to obtain both wide bandwidth and high gain. They are designed for low voltage offset, such that the input offset of each comparator is smaller than an LSB of the ADC. Otherwise, the offset of the comparator could falsely trip the comparator, resulting in a digital output code not representative of a thermometer code. A regenerative latch at each comparator typically stores the result. If this latch has positive feedback, such that the end state is forced to either a "1" or a "0." In general, there are a number of trade-offs for the various architectures. For Flash converters, the conversion time does not change materially with increased resolution. For successive approximation register ADCs (SAR) or pipelined Converters, this increases approximately linearly with an increase in resolution. For integrating ADCs, the conversion time doubles with every bit increase in resolution. The component matching for Flash ADCs typically limits resolution to around 8-bits. Calibration and trimming are sometimes used to improve the matching available on a chip. Component matching requirements double with every bit increase in resolution. This applies to Flash and SAR converters, but not integrating converters. For integrating converters, component matching does not materially increase with an increase in resolution. For Flash converters, every bit increase in resolution almost doubles the size of the ADC core circuitry. The power also doubles. In contrast, a SAR, pipelined or sigma-delta ADC die size will increase linearly with an increase in resolution, and an integrating converter core die size will not materially change with an increase in resolution. An increase in die size increases cost.

As compared to a SAR ADC, the Flash ADC is more expensive. In a SAR converter, the bits are decided by a single high-speed, high-accuracy comparator one bit at a time (from the MSB down to the LSB), by comparing the analog input with a DAC whose output is updated by previously decided bits and thus successively approximates the analog input. This serial nature of the SAR limits its speed to no more than a few Msps, while Flash ADCs exceed giga-sample per second (Gsps) conversion rates. The SAR converters also typically have higher resolutions than Flash ADCs with a much lower power.

With respect to pipelined ADCs, the pipelined ADC employs a parallel structure in which each stage works on one to a few bits of successive samples concurrently. This improves speed at the expense of power and latency. However, each pipelined stage is much slower than a Flash section. A pipelined ADC requires an accurate amplification in the DACs and interstage amplifiers, and these stages have to settle to a desired linearity level. By contrast, in a Flash ADC, the comparator only needs to be low offset and be able to resolve its inputs to a digital level (i.e., there is no linear settling time involved). However, some Flash converters require a pre-amplifier to drive the comparators. Gain linearity needs to be carefully specified in this type of ADC.

With respect to the integrated ADCs, these type of ADCs can achieve high resolutions and are relatively inexpensive and dissipate materially less power than a Flash ADC. Sigma-delta ADCs typically exceed a Flash ADC in that they achieve conversion rates up to 2 MHz with better resolution, such that they are more suitable for applications with much lower bandwidths, typically less than 1 MHz.

SUMMARY OF THE INVENTION

The present invention disclosed and claimed herein, in one aspect thereof, comprises a differential analog-to-digital data converter (ADC) for receiving a positive input signal and a negative input signal. A distributed resistive device is provided having taps associated therewith. A plurality of comparators each having a signal input and a reference input are provided, the signal input connected to one of the positive and negative input signals and the reference input connected to a tap on said distributed resistive device. A driver drives current through the distributed resistive device with one of the taps of the distributed resistive device disposed at substantially the other of the positive and negative input signals. A current varying device varys the current through the distributed resistive device to vary the voltage between taps.

BRIEF DESCRIPTION OF THE DRAWINGS

For a more complete understanding of the present invention and the advantages thereof, reference is now made to the following description taken in conjunction with the accompanying Drawings in which:

FIGS. 8 and 8a illustrate a block diagram of a comparator string;

FIG. 9 illustrates a timing diagram for the operation of the compare operation;

DETAILED DESCRIPTION OF THE INVENTION

Figure 1:
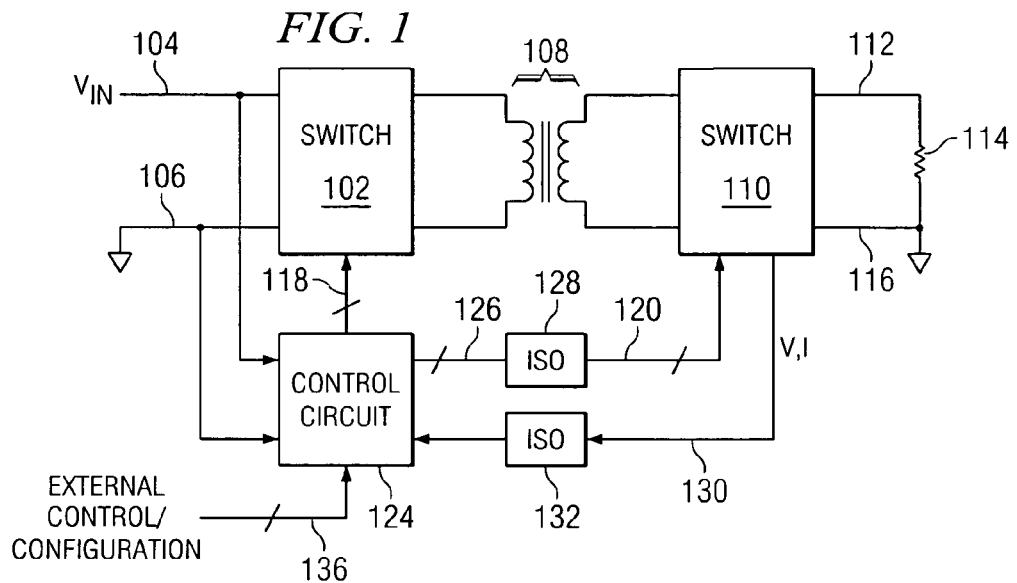
FIG. 1 illustrates an overall block diagram of a switching power supply utilizing the Flash ADC the present disclosure.

Referring now to FIG. 1, there is illustrated a top level schematic diagram for the switching power supply of the present embodiment. The main portion of the power supply comprises a primary switch group 102 that is operable to receive an input voltage on a node 104, this being a DC voltage, and ground on a node 106. The primary switch group 102 is coupled through an isolation transformer 108 to a secondary switch group 110. The secondary switch group 110 is operable to drive an output voltage node 112 that is connected to one terminal of a load 114, the secondary switch group 110 also having a ground connection on a node 116, the load 114 disposed between the node 112 and the node 116. The two switch groups 102 and 110 are operable to operate in conjunction with various pulse inputs on a control bus 118 associated with the primary switch group 102 and with various pulse inputs on a control bus 126 associated with the secondary switch group 110.

A digital control circuit 124 is provided which is operable to control the operation of the primary switch group 102 and the secondary switch group 110. The nodes 104 and 106 are provided as inputs to the digital control circuit 124 for sensing the voltage and current on the primary, the digital control circuit 124 generating the information on the bus 118 for control of the primary switch group 102. The control circuit 124 must be isolated from the secondary switch group 110. This is facilitated by driving a bus 126 through an isolation circuit 128, such as an opto-isolator, to drive the bus 120. Similarly, the control circuit 124 is operable to sense the voltage and current levels on the output node 112 through sense lines 130 which are also connected through an isolation circuit 132 to the digital control circuit 124. The digital control circuit 124 is also interfaced to a bus 136 to receive external control/configuration information. This can be facilitated with a serial data bus such as an SMB serial data bus.

Figure 2:
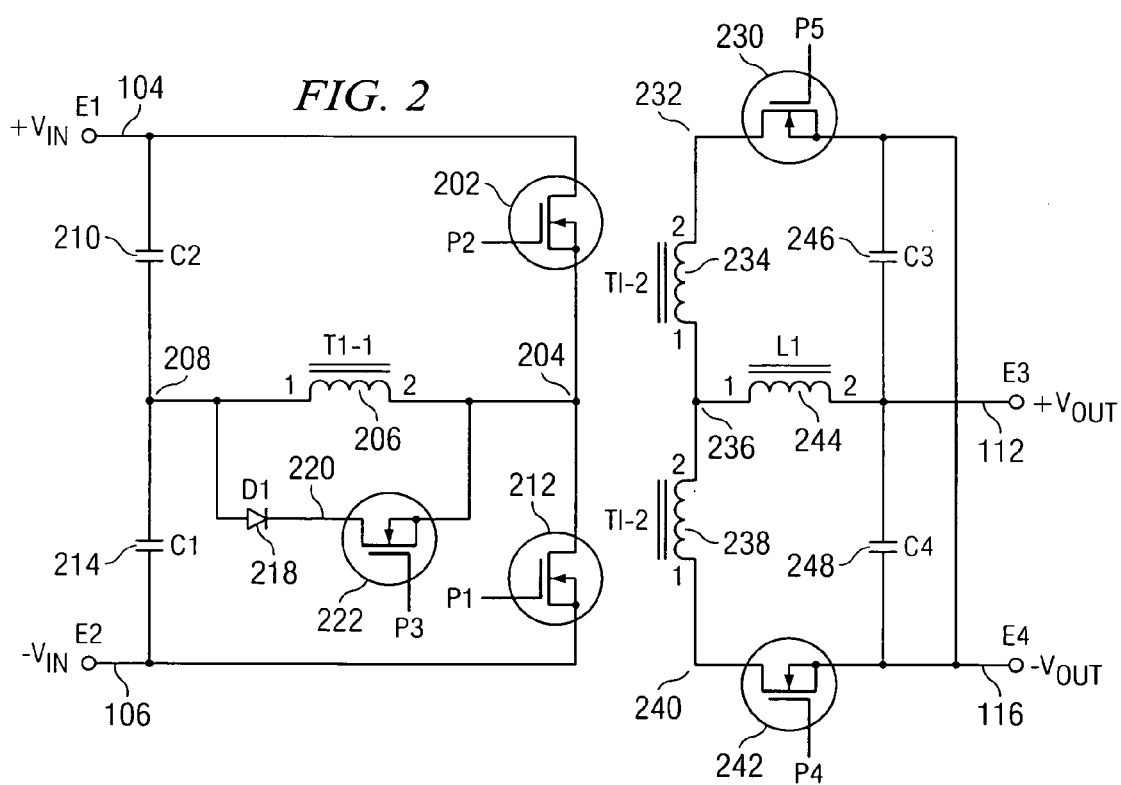
FIG. 2 illustrates a schematic diagram of the switching portion of a half-bridge power supply.

Referring now to FIG. 2, there is illustrated a detailed schematic diagram of the primary switch group 102, isolation transformer 108 and secondary switch group 110. The node 104 is connected to one side of the source-drain path of a power switching transistor 202, the other side thereof connected to a node 204. Node 204 is connected to one side of the primary of isolation transformer 108, a primary 206. The other side of primary 206 is connected to a node 208. Node 208 is coupled to node 104 through a capacitor 210. Node 106 is coupled to one side of the source-drain path of a switching transistor 212, the other side thereof connected to node 204. Node 208 is coupled through a capacitor 214 to node 106. A diode 218 has the anode thereof connected to node 208 and the cathode thereof connected to a node 220, node 220 connected to one side of the source-drain path of a switching transistor 222, the other side thereof connected to node 204.

Switching transistor 212 is controlled by a switching pulse P1, the gate of switching transistor 202 controlled by a switching pulse P2 and the gate of switching transistor 222 controlled by switching pulse P3. Switching pulses P1, P2 and P3 all form part of the bus 118.

The secondary switch group 110 is comprised of a switching transistor 230 having the source-drain path thereof connected between the node 116 and a node 232, the gate thereof controlled by a switching pulse P5. Node 232 is connected to one side of a winding 234 which forms part of the secondary of the isolation transformer 108. The other side of winding 234 is connected to a center tap node 236, node 236 connected to one side of a winding 238, the other side thereof connected to a node 240. Winding 238 and winding 234 form the secondary of transformer 108.

Node 240 is connected to one side of the source-drain path of a switching transistor 242, the other side thereof connected to node 116 and the gate thereof connected to a switching pulse P4. An inductor 244 is connected between node 236 and the output node 112. The output node 112 is coupled to the ground node 116 through a capacitor 246 which is connected proximate to the other side of the source-drain path of transistor 230 and coupled through a capacitor 248 to node 116 proximate to the other side of the source-drain path of switching transistor 242.

Figure 3:
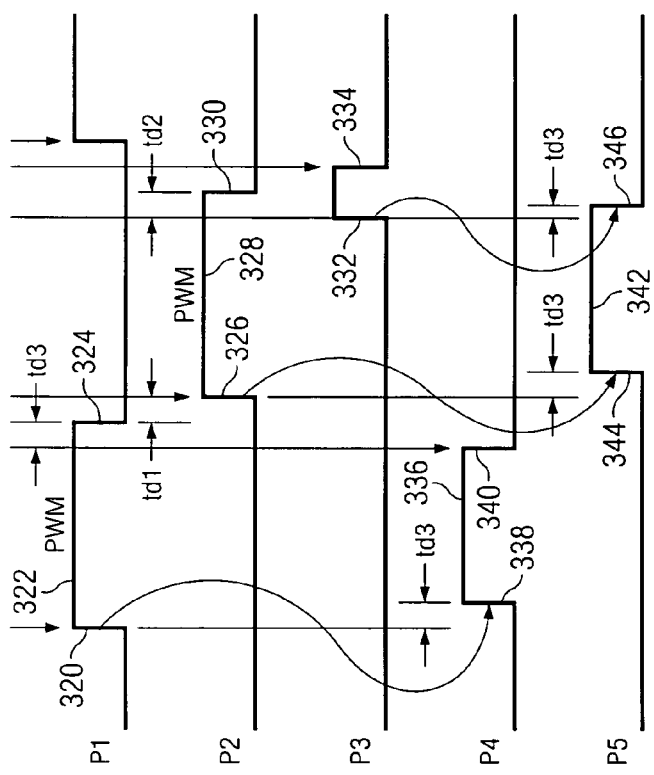
FIG. 3 illustrates the timing diagram for the control pulses to the switching power supply.

Referring now to FIG. 3, there is illustrated a timing diagram for generating the switching pulses to operate the switch of FIG. 2. The switching pulse P1 is a pulse-width modulated switching pulse having a rising edge 320. The rising edge 320 changes the level to a high level 322 which then returns to the low level at a falling edge 324. The switching pulse P2 is delayed from the falling edge 324 by a delay $t_{d1}$. The rising edge 326 changes the level of switching pulse P2 to a high level 328 followed by a change back to a low level having a falling edge 330. The switching pulse P3 goes from a low level to a high level ahead of the falling edge of P1 by delay time $t_{d2}$. The switching pulse P3 goes low ahead of the falling edge of P2 by delay time $t_{d3}$.

In the output switch, the switching pulse P4 goes from a low level to a high level 336 at a rising edge 338. The rising edge 338 is delayed from the rising edge 320 by a delay $t_{d3}$. The switching pulse P4 returns to a low level ahead of the falling edge P2 by delay time $t_{d3}$. The switching pulse P5 goes from a low level to a high level 342 at a rising edge 344 which is delayed from edge 326 of switching pulse P2 by a delay $t_{d3}$. Switching pulse P5 returns to a low level ahead of the rising edge of P3 by delay $t_{d3}$.

It can be seen that the switches 202 and 212 in FIG. 2 are controlled by switching pulses P1 and P2. The delay $t_{d1}$ is the duration of time required for transistor 212 to go from a conducting state to a non-conducting state and prior to transistor 202 going to a conducting state. The delay $t_{d1}$ is a delay that is required in order to ensure that the switches are completely off such that connecting the node 204 to the ground node 106 does not cause current to flow through transistor 202. This could result in a "shoot-through" current spike. Depending upon the circuit components and operating frequency, it may be necessary to vary this delay. Similarly, transistor 222 will be turned on prior to turning off switch 202 with the delay $t_{d2}$ allowing the diode 218 to be placed in parallel with the primary 206 prior to turning off transistor 202. Similarly, on the output switch, it is necessary that transistor 242 is maintained in a non-conducting state until transistor 322 is fully turned on and node 204 is sufficiently grounded. Further, it is necessary that the falling edge 346 be delayed until the transistor 222 has fully turned on, which requires the delay $t_{d3}$. This timing is conventional and, depending upon the application, the various delays will be adjusted, these adjustments due to the size of the load, circuit characteristics and operating frequency.

Figure 4:
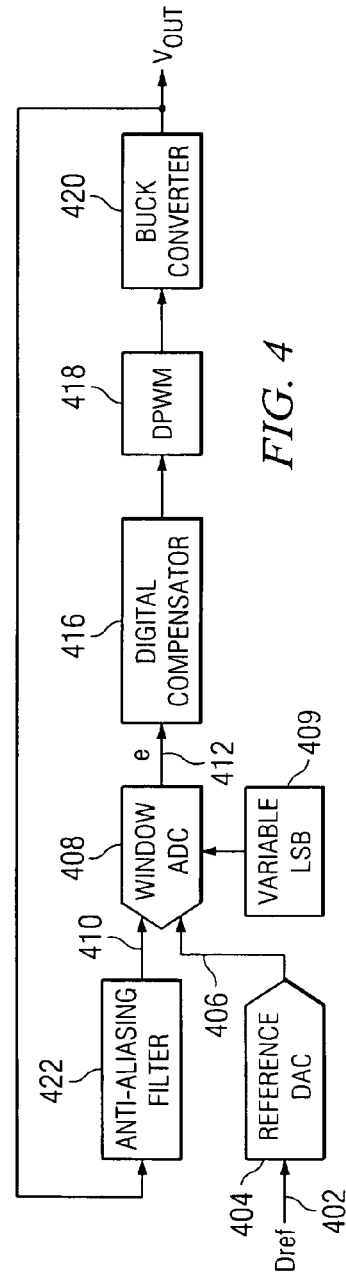
FIG. 4 illustrates an overall flow diagram for the digital switching power supply.

Referring now to FIG. 4, there is illustrated an overall flow diagram for the digital controller architecture. A digital reference voltage is provided on a digital input 402 which is input to a reference digital-to-analog converter (DAC) 404. This provides an analog output reference voltage on an analog line 406. This is input to one input of a window analog-to-digital converter (ADC) 408. The window ADC 408 is operable to receive a feedback analog signal 410 for comparison therewith. This generates a digital value on a digital output 412, which represents the error or the difference between the analog voltage levels on the analog lines 406 and 410. The ADC 408 has a n associated LSB, which is variable with the block 409. This error is input to a digital compensator 416 which is operable to compensate for phase lead due to the operation of an overall buck converter. This provides an output to a digital pulse width modulator 418 which is operable to generate the pulses necessary to control switches in a buck converter 420, one example of which was described in FIG. 2. In general, the digital pulse width modulator 418 will generate multiple pulses for controlling the switches over a single conversion cycle. This conversion cycle can have a length of approximately 2.5 microseconds, such that all switches in the buck converter 420 will be exercised during that period of time and current transferred from the DC-input to the load. The digital pulse modulator 418 is operable to have associated therewith a plurality of state machines that define the plurality of switch driving signals and the timing associated therewith, to allow the first pulse to be generated and then subsequent pulses to be delayed therefrom with their respective pulse widths defined. These state machines, as will be described herein below, allow a particular switching cycle to be facilitated with the defined pulse widths. As will be described in more detail herein below, the digital pulse width modulator 418 utilizes a reference clock generator at one frequency, 25 MHz in one embodiment, and then generates a higher resolution edge therefrom to in effect provide a resolution associated with a much higher clock on the order of 1 GHz. Then the output of the buck converter 420 is output back to the input of the ADC 408 through an anti-aliasing filter 422 in order to provide a filtered feedback analog signal on the analog line 410.

Figure 5:
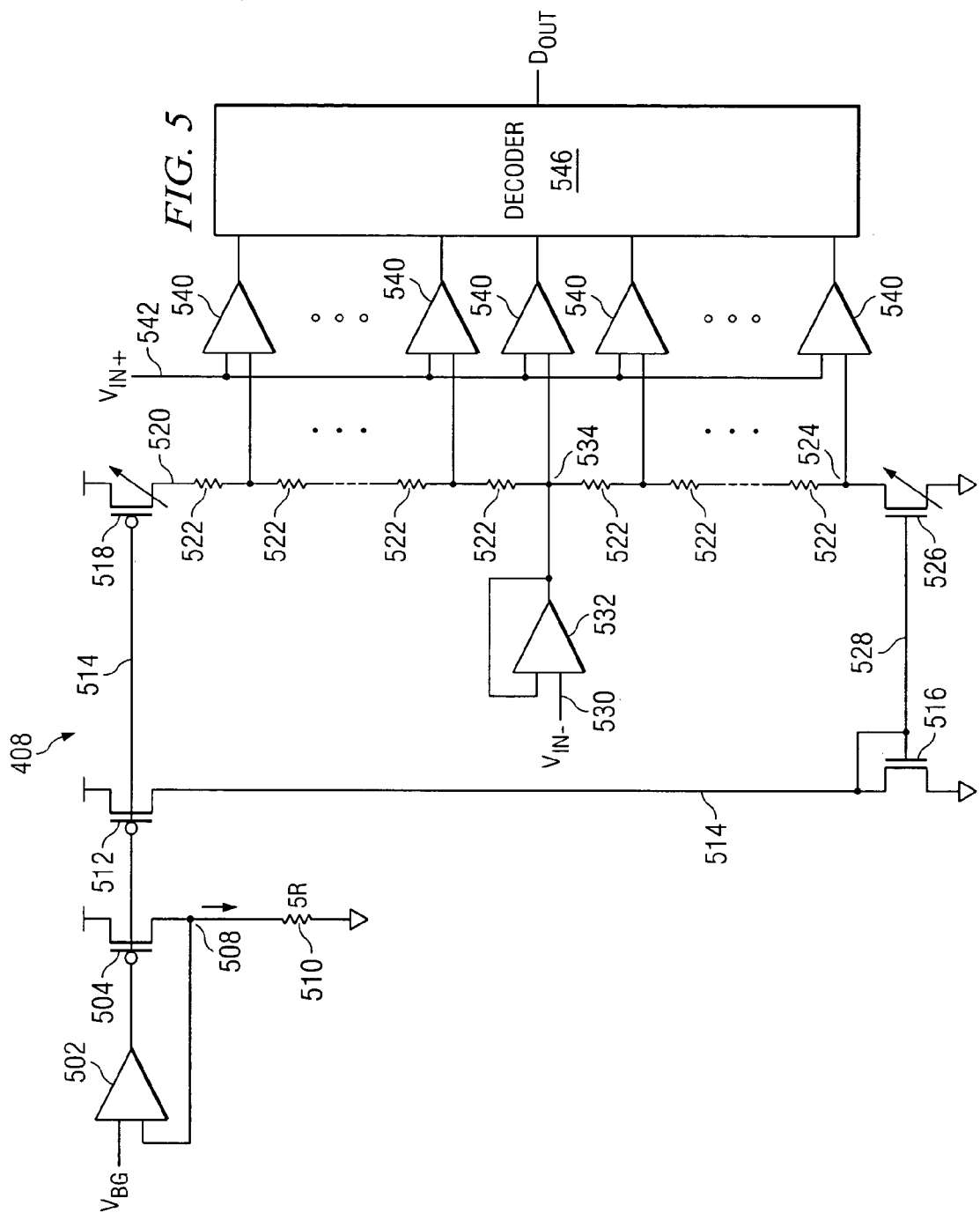
FIG. 5 illustrates an overall block diagram of the Flash ADC.

Referring now to FIG. 5, there is illustrated a logic diagram of the window ADC 408. A first reference voltage is generated by an on-chip bandgap generator, a voltage $V_{BG}$. The bandgap generator is a conventional circuit that combines a very stable voltage that is stable over temperature. This voltage is input to the voltage follower circuit comprised of an amplifier 502, the output thereof driving the gate of a p-channel transistor 504. The source/drain path of the transistor 504 is connected between $V_{DD}$ and a node 508. Node 508 is connected to the other input of amplifier 502, such that the amplifier 502 and transistor 504 provide a source follower configuration. Node 508 is connected to a string 510 of resistors of value "5 R." The output of amplifier 502 also drives a current mirror, such that the current through resistor string 510 is mirrored over to the current mirror. The current mirror is comprised of a p-channel transistor 512 and the gate thereof connected to a node 514, node 514 connected to the output of amplifier 502. The source/drain of transistor 512 is connected between $V_{DD}$ and a node 514. Node 514 is connected to one side of the source/drain path of an n-channel transistor 516, the other side thereof connected to ground. The gate and drain transistor 516 are connected together to node 514 to form a diode-connected configuration. Node 514 is also connected to a variable width p-channel transistor 518, the source/drain path thereof connected between $V_{DD}$ and a node 520. Transistor 518, as will be described herein below, is comprised of a plurality of parallel connected binary-weighted transistors, the connection thereof being programmable, such that one or all of the parallel connected transistors can be connected in parallel on a selective basis.

Node 520 is connected on one side thereof to a resistor string comprised of a plurality of resistors 522. There are provided sixty four of these resistors 522 having a total resistive value of "R," each having a voltage disposed there across equal to the voltage of a least significant bit (LSB) of the ADC. This will be described in more detail herein below. The bottom of the resistor string of resistors 522 is connected to a node 524, which is connected on one side thereof to the drain of a variable n-channel transistor 526, the source thereof connected to ground, and the gate thereof connected to the gate of transistor 516 on a node 528. Transistor 526 is substantially identical to transistor 518 and is also programmable to allow selection of the number of transistors connected together, which will be described in more detail herein below.

A voltage input on an input node 530 represents the negative input voltage. This is input to one input of a unity gain amplifier 532, which has the other input thereof connected to the output on a node 534. Node 534 represents the mid-point of the resistor string of resistors 522, such that there are an equal number of resistors above as below. Thus, for the disclosed embodiment of sixty four resistors 522, there will be thirty two resistors above and thirty two resistors below the point 534. The unity gain amplifier 532 provides the drive voltage node 534 and isolates the input voltage on node 530 therefrom.

The current through resistor string 510 is ratiometrically related to the current through transistors 518 and 526 and all of the resistors 522. Thus, the current through resistors 522 is set by the current through resistor string 510, which current is set by the voltage on the input to amplifier 502, voltage $V_{BG}$, such that the voltage is $V_{BG}/5$ R. The only way to vary the voltage of the resistors 522 is through the ratio of the size of the transistors 518 and 526 to the size of the transistor 504. This will be described in more detail herein below.

Each of resistors 522, at the bottom thereof, is connected to one of sixty four comparators on one input thereof of comparators 540, on one input thereof. (It is noted that the number sixty four defines a "window," but any number of comparators could be utilized to represent the entire Flash ADC window). The other input of each of the comparators 540 is connected to a node 542, which is connected to the positive input voltage $V_{IN+}$. Therefore, the output of each of the respective comparators will be a "0" if the input voltage is below the resistor tap voltage and a "1" if the input voltage is above the associated tap voltage. The outputs of all of the comparators 540 having the reference input connected to resistor taps below the input voltage will have a "1" on the output thereof. This, therefore, represents a thermometer code on the output thereof. This is input to a decoder 546 to decode the thermometer code and provide the digital output therefrom.

The output voltage from decoder 546, $D_{OUT}$, represents the difference voltage between the voltage on node 542 and the voltage on node 530, $V_{IN+}-V_{IN-}$. By comparing the positive input voltage on node 542 to the negative input voltage on node 530, the output voltage, $V_{OUT}$, will have a resolution defined by the voltage across each of the resistors 522, this being the LSB of voltage. This overall circuit provides the circuitry of the Flash ADC, this being a "window" Flash ADC as opposed to an absolute value ADC. When the difference between the voltage on positive input voltage node 542 and negative input voltage node 530 is "0," the comparators 540 below the node 534 will have a "1" on the output thereof and the comparator 540 having the reference input thereof connected to node 534 will have a "0" on the output thereof. This, as will be described herein below, represents the "0" code for the Flash ADC, this being a differential input ADC. As the size of the transistors 518 and 526 is varied, this will vary the current through the resistors 522 and, therefore, vary the size of the LSB. However, the "0" code will not vary. In effect, the negative input voltage on node 530 represents the reference voltage input of the ADC whereas the positive input voltage on node 542 represents the analog input voltage.

Figure 6:
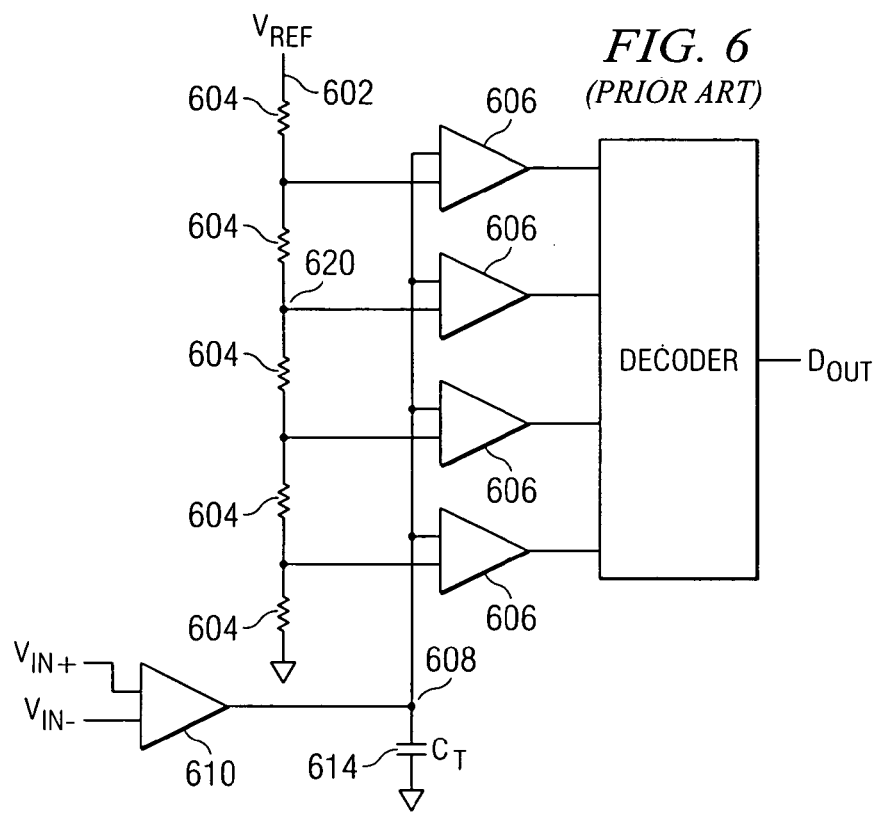
FIG. 6 illustrates a prior art Flash ADC.

To distinguish the current architecture of the Flash ADC with a conventional architecture, the prior art Flash ADC of FIG. 6 will be described. In FIG. 6, a four comparator Flash ADC is described. A reference voltage is defined that is variable, this being for the purpose of varying the size of the LSBs. This reference voltage is provided on a node 602 at the top of a resistor ladder comprised of a plurality of tapped resistors 604. At each of the taps, there is an output provided to the reference input of an associated comparator 606. The other input on each of the comparators 606 is connected to an input node 608. For a single ended input, the reference voltage on node 602 will typically be connected to the supply voltage and resistor 604 adjusted such that the full rail-to-rail voltage could be provided. In this example, this would only provide a resolution of ¼ of the supply voltage. Typically, a very large number of comparators 606 will be provided associated with a large number of resistors. For a 16-bit Flash ADC, this would require $2^{16}$ comparators and a corresponding number of resistors. This results in a significant power consumption for each of the comparators. However, for a differential input signal, it is only necessary to resolve the difference between a positive and negative input signal over a defined range. Thus, a smaller reference voltage can be utilized which is divided by a predetermined number of resistors in the corresponding comparator 606. In a prior art embodiment, the differential input voltage is determined by a differential amplifier 610 receiving the positive and negative input voltage and outputting a differential voltage on node 608. This differential voltage is then input to the input of each of the comparators 606. Of course, in order to utilize the full range, the output of the amplifier 610 must be centered around some common node voltage which is equal to $V_{REF}/2$. In one alternate embodiment, the prior art system of FIG. 6 can have the LSB is changed by a factor of, for example, 10×, which will require the common mode voltage, $V_{CM}=V_{REF}/2$, to change by a factor of 10×. Although this will provide a stable zero code, the common mode voltage, $V_{CM}$, of the amplifier 610 should be around $V_{CM}/2$ in order to have a large voltage swing.

Associated with each of the inputs of the comparator 606, is a distributed capacitance, which distributed capacitance would sum up to a total capacitance of $C_T$, represented by capacitor 614. It can be seen that the amplifier 610 must drive the capacitance 614 during a conversion operation. By reducing the number of comparators in the "window," the value of $C_T$ can be reduced, in addition to the power consumption. However, the amplifier 610 must still drive this input with a capacitance.

Figure 7:
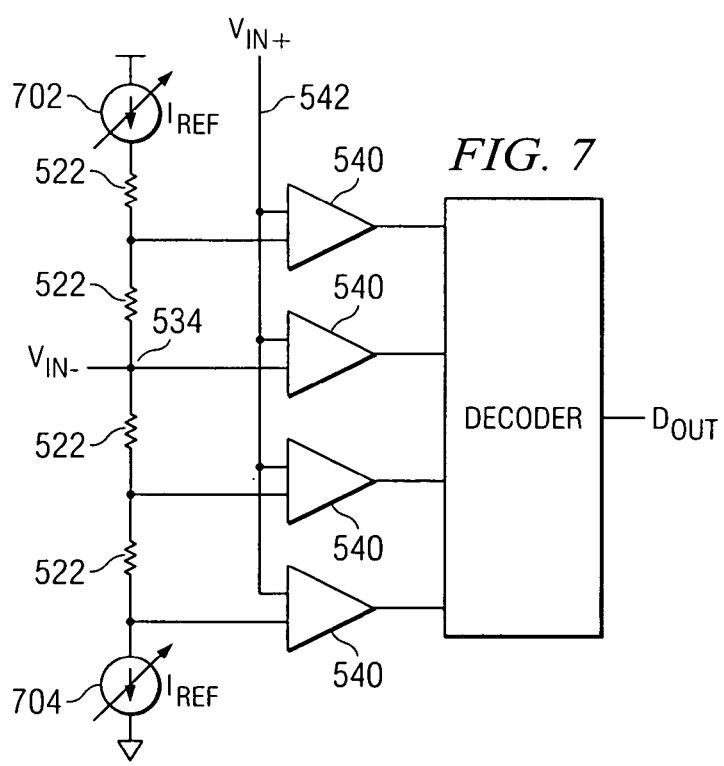
FIG. 7 illustrates a more detailed diagram of the comparator portion of the Flash ADC of the present disclosure.

Referring now to FIG. 7, there is illustrated a simplified diagram of the disclosed ADC of FIG. 5, which is utilized for comparison therewith to the prior art embodiment of FIG. 6. In this embodiment, it can be seen that the resistive string comprised of the resistors 522 are driven by an upper current source 702 from the supply voltage, $V_{DD}$, and the bottom of the resistive string is driven with a lower current source 704. Both of these current sources provide a current $I_{REF}$, which is variable. This variable current source varies the current through the resistors 522 and, therefore, sets the size of the LSB or, more specifically, the resolution of the ADC. The voltage on the node 534 is a negative input voltage and this provides the center reference voltage of the window with the current sources 702 and 704 in conjunction with the current through the resistors, providing the LSB voltage increments increasing toward current source 702 and decreasing toward current source 704. As the voltage on node 534 varies, the voltage across node resistors 522 does not vary, as that voltage is controlled by the current sources 702 and 704. However, if the current value of the current sources 702 and 704 is varied, then the size of the LSB voltage will vary.

As will be described herein below, each of the current sources 702 an 704 are identical and are comprised of four separate parallel connected current sources, each having a binary-weighted current there through, such that a binary word can be input thereto for defining the value thereof. In the disclosed embodiment, there are provided four current sources, a 1x current source, a 2x current source, a 4x current source and an 8x current source, associated with a 4-bit word. This, however, is not meant to be limiting in that any number of current sources could be utilized, and any type of variable method for varying the current source could be utilized.

With reference to FIG. 6, it can be seen that, if the LSB size is varied through a variation of the reference voltage, this will cause the reference voltage on the zero-code node to change. If, for example, a node 620 associated with the second from the top comparator 606 on the reference input thereof represents the zero-code wherein the positive input voltage equals the negative input voltage, then, when the positive input voltage equals the negative input voltage, this comparator will have a "0" on the output thereof, comparators above will have a "0" output and comparators below will have a "1" output. As long as the voltage difference is "0," and the reference voltage is not varied, then the zero-code will not change but, if the voltage $V_{REF}$ is changed, the size of the LSB will change and the zero code will also change, since the zero-code is now "coupled" to the value of $V_{REF}$. Therefore, if the LSB is required to be changed, then the tap associated with the resistor string that defines the zero-code may change. This will be described in more detail herein below.

The output voltage, $V_{OUT}$ is defined in the following equation:

$$D_{OUT}=(V_{IN+}-V_{IN-})G$$

The value of G is related to the inverse of LSB as follows:

$$G = \frac{1}{LSB \text{ size}}$$

The current through the resistor string is a ratiometric current such that it is the current through the resistor string 510 multiplied by a ratio metric factor α. Thus, the current through the resistor string of resistors 522 provided by transistors 518 and 526 is:

$$\frac{V_{BG}}{5R}\alpha$$

where:

R is the total value of the sixty four resistors 522 in the ladder; and

α is a scaling or ratiometric factor.

Thus, the LSB is defined as the current through a given resistor and it will be multiplied by the current through the resistor string multiplied by the value of resistor, R, as follows:

$$\left(\frac{V_{BG}}{5R}\alpha\right)\frac{R}{K} = \frac{V_{BG}}{5K}\alpha$$

where:

K is a factor representing the number of resistors 522 in the resistor string, there being sixty four in the disclosed embodiment.

As noted herein above, the ratio metric multiplier is a binary weighted multiplier that, in the disclosed embodiment, utilizes a 4-bit word. This will be defined by the following relationship:

$$LSB = \left(\frac{V_{BG}}{5K}\right)\cdot\left(\frac{2^3\cdot b3 + 2^2\cdot b2 + 2^1\cdot b1 + 2^0\cdot b0}{2}\right)$$

where:

$$\alpha = \left(\frac{2^3\cdot b3 + 2^2\cdot b2 + 2^1\cdot b1 + 2^0\cdot b0}{2}\right)$$

Thus, it can be seen that the value of R is removed from the equation such that temperature and process variations therein do not affect the value of the LSB. All that is necessary is to have a stable voltage, this provided by the bandgap voltage generator.

Referring now to FIGS. 8 and 8a, there is illustrated a logic diagram for a comparator bank, each comparator bank representing each of the comparators 540. This comparator string is a differential comparator having a positive input and a negative input. The positive input is connected to the positive input voltage on the node 542 which is connected to the voltage $V_{IN+}$. The other input is connected to a node 802 which is the tap voltage $V_{TAP}$, this reference input to the comparator. There is provided a first comparator 804 having a reference voltage input on node 806 and a primary input on a node 808. Node 802 is connected to one side of a switch 810, the other side thereof connected to node 806. Similarly, the node 542 is connected through one side of a switch 812, the other side thereof connected to node 808. Node 802 is also connected to one side of two switches 814 and 816, the other sides thereof connected to the nodes 808 and 806, respectively. Switches 810 and 812 are controlled by the clock signal Φ1 and the switches 814 and 816 are controlled by the clock signal Φ2.

The output of comparator 804 is provided on differential outputs 820 and 822. Output 820 is connected to one side of a sample capacitor 824 and the node 822 is connected to one side of a sample capacitor 826, both having a value of "C." The other side of the capacitor 824 is connected to a node 828, which comprises one input of a second comparator 830. The other side of capacitor 826 is connected to a node 832, which is connected to the other input of the comparator 830, the comparator 830 being a differential input comparator. Node 828 is connected to one side of a switch 834, and the other side thereof is connected to a differential output node 836 of comparator 830. Similarly, node 832 is connected to one side of a switch 838, the other side thereof connected to a second differential output node 840 of differential comparator 830. Nodes 836 and 840 are connected to the differential inputs of a reconfigurable latch 842. Switches 834 and 838 are controlled by a clock signal Φ1'. The reconfigurable latch 842 is controlled by a clock signal Φ3. The reconfigurable latch 842 is operable to provide a latched output on differential outputs 844 and 846 for input to the dynamic latch 848, which is controlled by a clock signal Φ4. This provides a latched output for input to a T-latch 846, which is clocked by a clock signal to provide a data output, this being the output of the overall comparator 540.

Referring now to FIG. 9, there are illustrated timing diagrams for the clock signals associated with the embodiment of FIG. 8. The operation of the comparator bank will be described with reference to these clock signals. When Φ1 goes high, as denoted by an edge 902, the switches 812 and 810 will close, resulting in the output of the respective voltage on the respective nodes 820 and 822. Shortly thereafter, the clock signal Φ1' will go high at an edge 904. This will result in switches 834 and 838 closing, thus reducing the gain of the comparator 830 such that the voltage on nodes 836 and 840 is substantially the same. At this time, the switches 814 and 816 are open, since the clock Φ2 is low at this time. This is the sampling operation. Thereafter, Φ1 goes low at an edge 906 and Φ2 goes high at an edge 908, thus opening switches 542 and 810 and closing switches 814 and 816. This, in effect, disposes the nodes 820 and 822 at the same voltage or substantially the same voltage, thus "boosting" the other side of capacitors 824 and 826 to the voltages that were previously on the nodes 820 and 822. In general, the voltage on the input to the comparator 804 on nodes 808, 806 comprises the difference voltage $V_{IN+}-V_{TAP}$. The output voltage of the comparator 804 will have an offset voltage $V_{OSI}$ associated therewith. This offset voltage and difference voltage will be multiplied by the gain of comparator 804, a gain $A_f$. Therefore, the output voltage on nodes 820 and 822 will be $A_f(V_{IN+}-V_{TAP}+V_{OSI})$. When Φ2 goes high at 908, this represents the "hold" operation. Therefore, this represents a sample and hold operation. However, when switches 814 and 816 are closed, the voltage across nodes 820 and 822 is $V_{OSI}$ and, therefore, the voltage across nodes 828 and 832 will now be $(V_{IN+}-V_{TAP})$, such that the offset voltage associated with the comparator 804 is effectively removed in the hold operation.

It can further be seen that the capacitors 824 and 826 are isolated from nodes 542 and 802. Thus, the analog input voltage that is input on node 542 will not be required to drive a large capacitance. The amplifier 532 isolates the negative input voltage on node 530 from node 534 and from all the subsequent tap voltages. However, the input voltage on node 542 is required to drive the inputs of each of the multiple comparators 540. The sampling operation requires a larger capacitance for the purpose of holding the charge for a predetermined amount of time. Since this larger capacitor is disposed on the opposite side of comparator 804, it can be seen that the need for driving a very large capacitance and holding the voltage on that large capacitance is reduced, as the charge driven to the capacitor is driven from internal circuitry to the comparator 804, as opposed to a driving circuit associated with the node 542. Thus, the drive of the sampling capacitors is distributed among all of the comparators 540.

Figure 10:
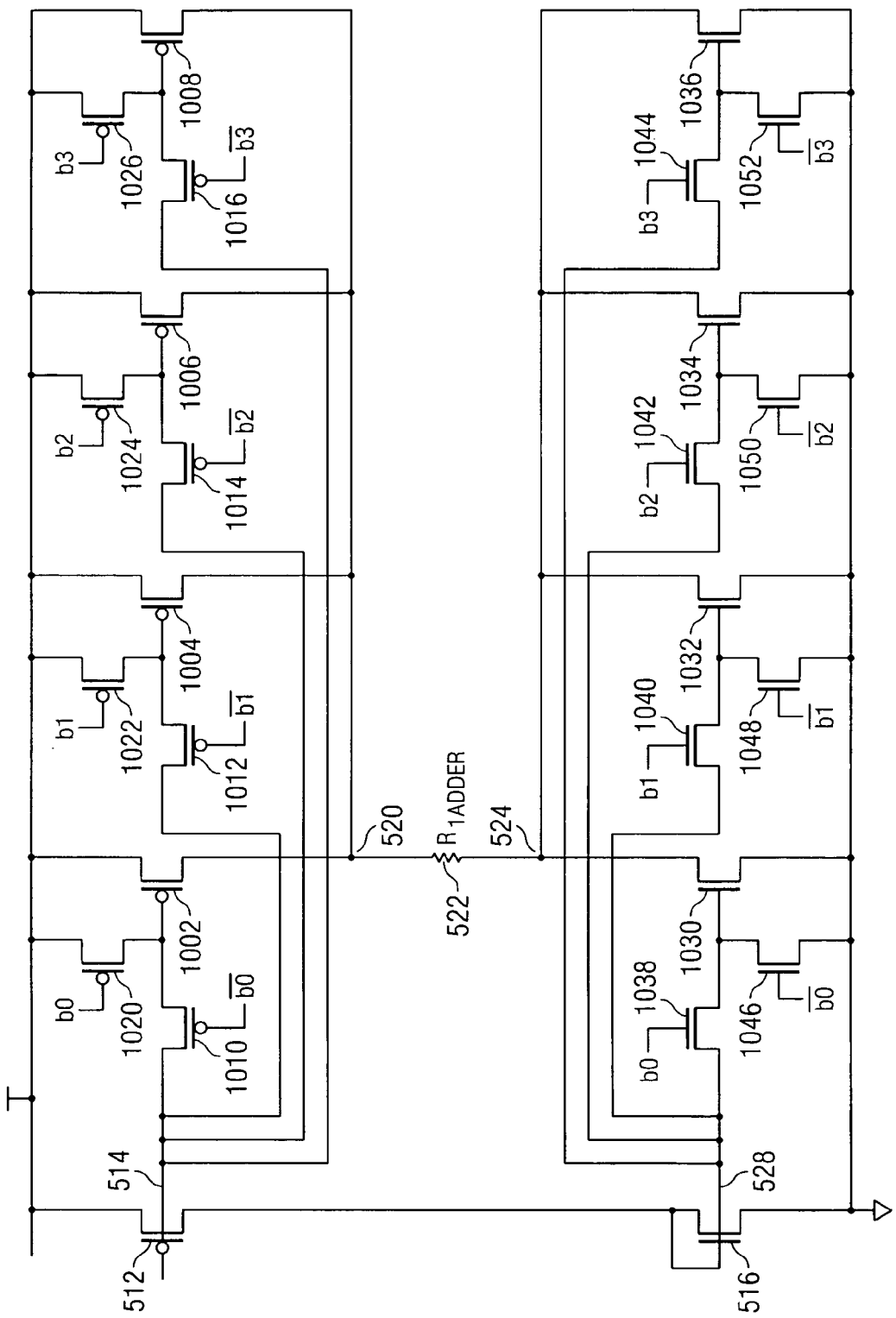
FIG. 10 illustrates a schematic diagram of the bias circuitry for the resistor ladder.

Referring now to FIG. 10, there is illustrated a schematic diagram of the transistors 518 and 526. The transistor 518 is comprised of four binary weighted transistors 1002, 1004, 1006 and 1008, each of these being a p-channel transistor having the source/drain path thereof connected on one side thereof to the supply voltage $V_{DD}$. The other side of the source/drain path thereof is connected to the node 520. The gate of transistor 1002 is connected through the source/drain path of a p-channel transistor 1010 to node 514, the gate thereof connected to bit b0-Bar. The gate of transistor 1004 is connected to node 514 through the source/drain path of a p-channel transistor 1012, the gate thereof connected to bit b1-Bar. The gate of transistor 1006 is connected to node 514 through the source/drain path of a p-channel transistor 1014, the gate thereof connected to bit b2-Bar. The gate of transistor 1008 is connected to node 514 through the source/drain path of a p-channel transistor 1016, the gate thereof connected to bit b3-Bar. Therefore, when the respective bits are a logic "high," then the respective gate transistors 1010–1016 will connect the gate of the respective transistors 1002–1008 to node 514. Transistors 1002–1008 are binary weighted in size. The transistor 1002 has a size of, for reference purposes, 8×, transistor 1004 has a size of 2×, transistor 1006 has a size of 4× and transistor 1008 has a size of 24×. Therefore, the amount of current that will flow through the transistors is correspondingly larger. This provides the binary weighting, a fairly conventional weighted current scheme.

When the transistors 1002–1008 are deselected, their gates will be pulled high. A pull-up p-channel transistor 1020 has the source/drain path thereof connected between the gate of transistor 1002 and a supply voltage $V_{DD}$ and the gate thereof connected to bit b0. A pull-up p-channel transistor 1022 has the source/drain path thereof connected between $V_{DD}$ and the gate of transistor 1004 and the gate thereof connected to bit b1. A pull-up p-channel transistor 1024 has the source/drain path thereof connected between $V_{DD}$ and the gate of transistor 1006 and the gate thereof connected to bit b2. A pull-up p-channel transistor 1026 has the source/drain path thereof connected between $V_{DD}$ and the gate of transistor 1008 and the gate thereof connected to bit b3.

The transistor 526 is comprised of four n-channel transistors 1030, 1032, 1034 and 1036 having the source/drain paths thereof connected between node 524 and ground and sized in a binary weighted manner similar to transistors 1002–1008, such that they are respectively identical thereto in size. The gate of transistor 1030 is connected to node 528 through an n-channel transistor 1038, the gate thereof connected to bit b0. The gate of transistor 1032 is connected through an n-channel gate transistor 1040 to node 528, the gate thereof connected to bit b1. The gate of transistors 1034 is connected through an n-channel gate transistor 1042 to node 528, the gate thereof connected to bit b2. The gate of transistor 1036 is connected through an n-channel gate transistor 1044 to node 528, the gate thereof connected to the bit b3. Thus, by selecting the ones of the gated transistors 1038–1044, the binary weighted transistors 1030–1036 can be selectively connected between node 524 and ground. When not selected, the gates thereof are pulled low through the source/drain paths of pull-down n-channel transistors 1046, 1048, 1050 and 1052, respectively. The gates of transistors 1046–1052 are connected to bits b0-Bar, b1-Bar, b2-Bar and b3-Bar, respectively.

Figure 11:
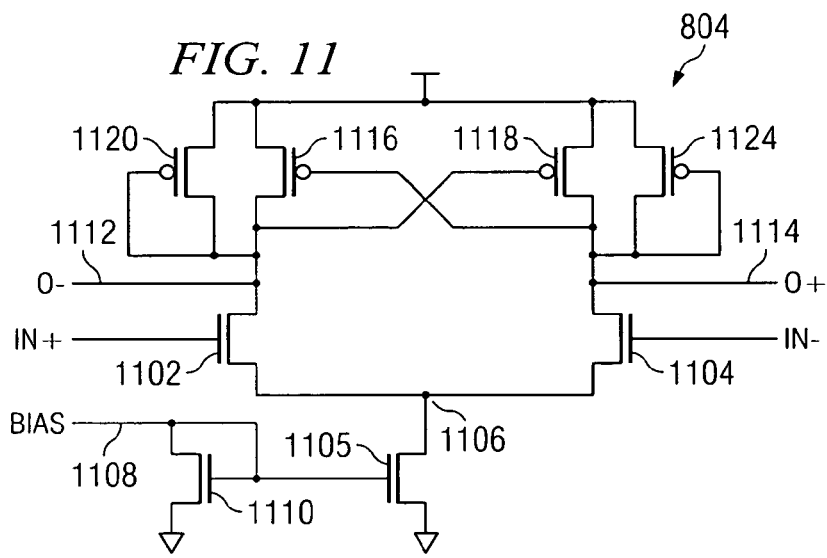
FIG. 11 illustrates a schematic diagram for the first comparator section.

Referring now to FIG. 11, there is illustrated a schematic diagram of the comparator 804. This is a differential input comparator that is comprised of two differential input n-channel transistors 1102 and 1104 having the sources thereof connected in a common source configuration to a common source node 1106. Node 1106 is connected through the source/drain path of an n-channel transistor 1103 to ground, the gate thereof connected to a bias voltage on a node 1108. A diode connected n-channel transistor 1110 has the source/drain path thereof connected between node 1108 and ground and the gate thereof connected to node 1108. This provides the bias for the node 1106 for the transistor 1103. The drain of transistor 1102 is connected to a negative output node 1112 and the drain of transistor 1104 is connected to a node 1114, the positive output node. A cross coupled p-channel transistor pair comprised of a p-channel transistor 1116 connected between $V_{DD}$ and node 1102 at a p-channel transistor 1118 connected between $V_{DD}$ and node 1104 is configured such that the gate of transistor 1116 is connected to the opposite node, node 1114, and the gate of transistor 1118 is connected to the opposite node, node 1112. A diode connected p-channel transistor 1120 is connected between $V_{DD}$ and node 1112, the gate thereof connected to node 1112. A diode connected p-channel transistor 1124 is connected between $V_{DD}$ and node 1114, the gate thereof connected to node 1114. The gate of transistor 1102 is the positive input and the gate of transistor 1104 is the negative input.

Figure 12:
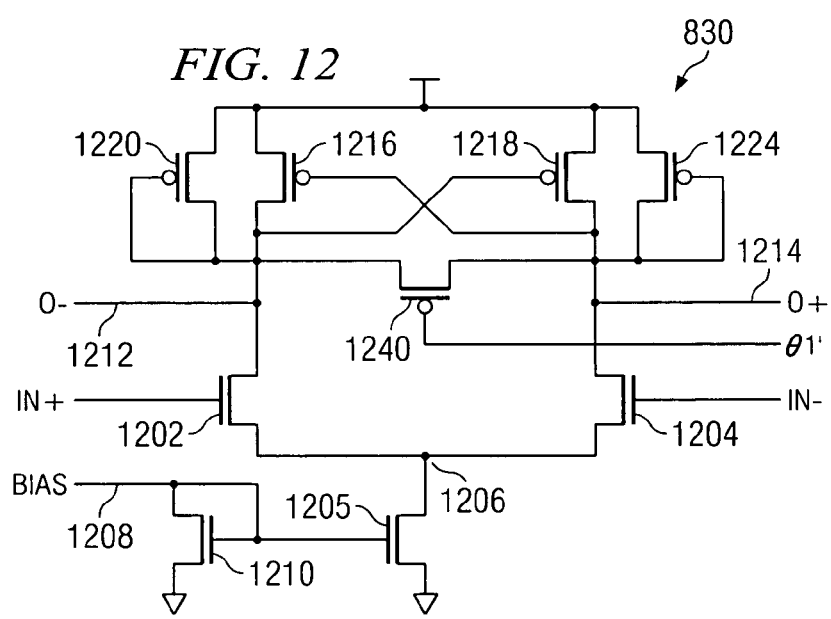
FIG. 12 illustrates a schematic diagram for the second comparator section.

Referring now to FIG. 12, there is illustrated a schematic diagram of the comparator 830. This is a differential input comparator that is comprised of two differential input n-channel transistors 1202 and 1204 having the sources thereof connected in a common source configuration to a common source node 1206. Node 1206 is connected through the source/drain path of an n-channel transistor 1203 to ground, the gate thereof connected to a bias voltage on a node 1208. A diode connected n-channel transistor 1210 has the source/drain path thereof connected between node 1208 and ground and the gate thereof connected to node 1208. This provides the bias for the node 1206 for the transistor 1203. The drain of transistor 1202 is connected to a negative output node 1212 and the drain of transistor 1204 is connected to a node 1214, the positive output node. A cross coupled p-channel transistor pair comprised of a p-channel transistor 1216 connected between $V_{DD}$ and node 1202 and a p-channel transistor 1218 connected between $V_{DD}$ and node 1204 is configured such that the gate of transistor 1216 is connected to the opposite node, node 1214, and the gate of transistor 1218 is connected to the opposite node, node 1212. A diode connected p-channel transistor 1220 is connected between $V_{DD}$ and node 1212, the gate thereof connected to node 1212. A diode connected p-channel transistor 1224 is connected between $V_{DD}$ and node 1214, the gate thereof connected to node 1214. The gate of transistor 1202 is a positive input and the gate of transistor 1204 is the negative input. This is a conventional design.

A p-channel transistor 1240 that has the source/drain path thereof connected between nodes 1212 and 1214 and provides a short circuit for a short duration of time prior to the leading edge of Φ1' to prevent kickback. The gate of transistor 1240 is connected to a clock signal Φ1$_{pre}$, such that, when activated, the gain of the comparator stage 803 is substantially reduced. This clock signal is not shown in /FIG. 9.

Figure 13:
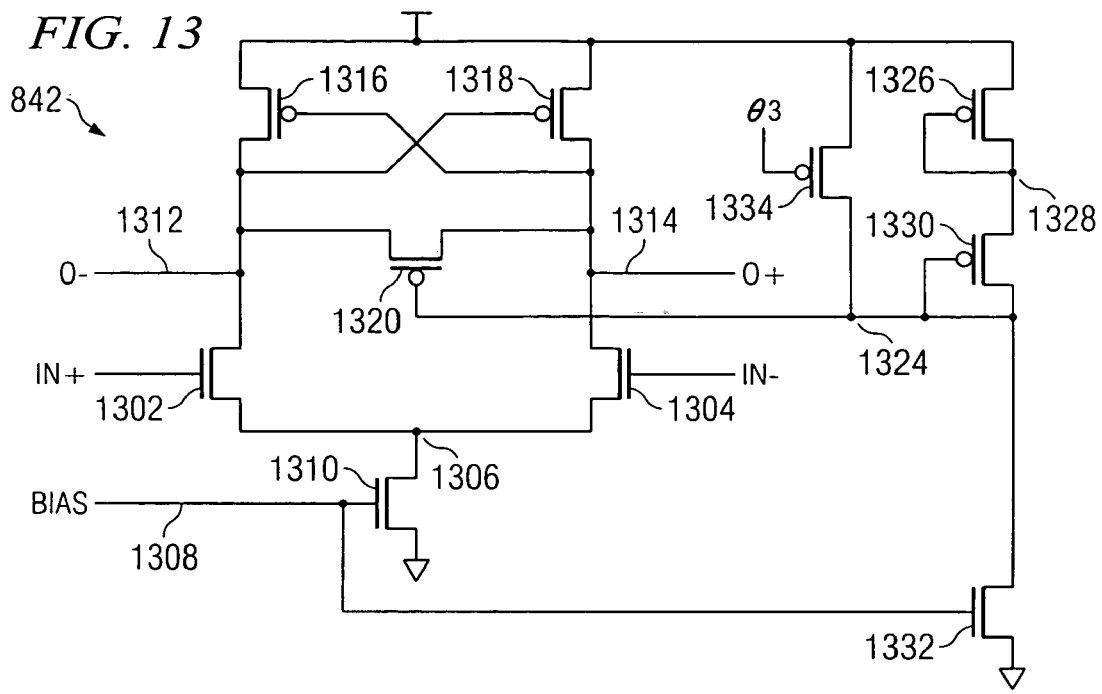
FIG. 13 illustrates a schematic diagram for the reconfigurable latch.

Referring now to FIG. 13, there is illustrated a schematic diagram of the reconfigurable latch 842. This latch has two modes of operation. In the first mode, the gain is set at a relatively low gain and, in a second mode, the gain is increased substantially. The input is provided by a common source pair of differential input n-channel transistors 1302 and 1304, having the source thereof connected to a common source node 1306. The n-channel transistor 1308 is connected between node 1306 and ground with the gate thereof connected to a bias voltage on a node 1310. The drain of transistor 1302 is connected to a negative output node 1310 and the drain of transistor 1304 is connected to a node 1312, the positive output node. A cross-coupled pair of p-channel transistors 1316 and 1318 is provided, with the source/drain path of transistor 1316 connected between $V_{DD}$ and node 1310 and the source/drain path of transistor 1318 connected between $V_{DD}$ and node 1312. The gate of transistor 1316 is connected to node 1312 and the gate of transistor 1318 is connected to node 1318. A p-channel transistor 1320 has the source/drain path thereof connected between nodes 1310 and 1312 and the gate thereof connected to a node 1324. A diode connected p-channel transistor 1326 is connected between $V_{DD}$ and a node 1328 (p-channel), the gate thereof connected to node 1328. A second diode connected p-channel transistor 1330 is connected between node 1328 and node 1324, the gate thereof connected to node 1324. An n-channel transistor 1332 is connected between node 1324 and ground, the gate thereof connected to the bias voltage on node 1310. A p-channel transistor 1334 has the source/drain path thereof connected $V_{DD}$ and node 1324, the gate thereof connected to the clock signal Φ3. In general, the transistor 1320 is operated in the triode region and, therefore, when turned on, constitutes a resistor. The input impedance looking into the source of transistor 1316 and into the source of transistor 1318 is equal to $-1/g_m$. When transistor 1320 is turned on, it provides a resistance, $R_{1320}$, that is disposed in parallel with this impedance. Initially, this is a negative impedance until a transistor is turned on, at which time it is impedance above zero, which, when turned on, results in a relatively low gain. When turned off, the gain goes high. Thus, when Φ3 goes high, node 1340 is biased to place the transistor 1320 in the triode region. This occurs at an edge 910 on the waveform Φ3 in FIG. 9. This occurs prior to the switches 814 and 816 closing in response to Φ2 going high at the edge 908. Thus, prior to the sample operation, the latch 842 is configured for a low gain operation. When Φ2 goes high at edge 908, the reconfigurable latch 842 will evaluate the difference voltage at the gates of transistors 1302 and 1304 which will result in a difference voltage generated across the output nodes 1310 and 1312 with a gain of two. When Φ3 goes low at an edge 912, this value will be latched on the outputs.

Figure 14:
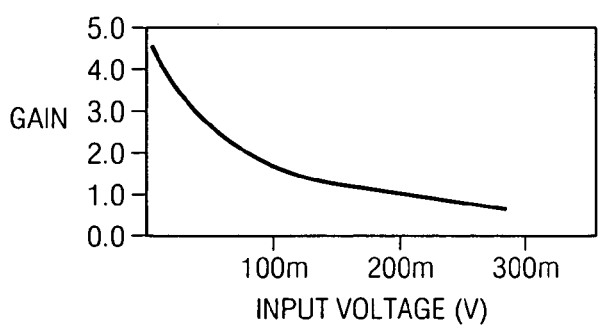
FIG. 14 illustrates a gain response curve for the reconfigurable latch.

Referring now to FIG. 14, there is illustrated a plot of gain of the reconfigurable latch when Φ3 is high. It can be seen that the gain varies from a value of 4.5 at a substantially zero voltage input to a value of 1.5 at a voltage of 100 millivolts and a voltage of 1.0 at a value of 200 millivolts on the input.

Figure 15:
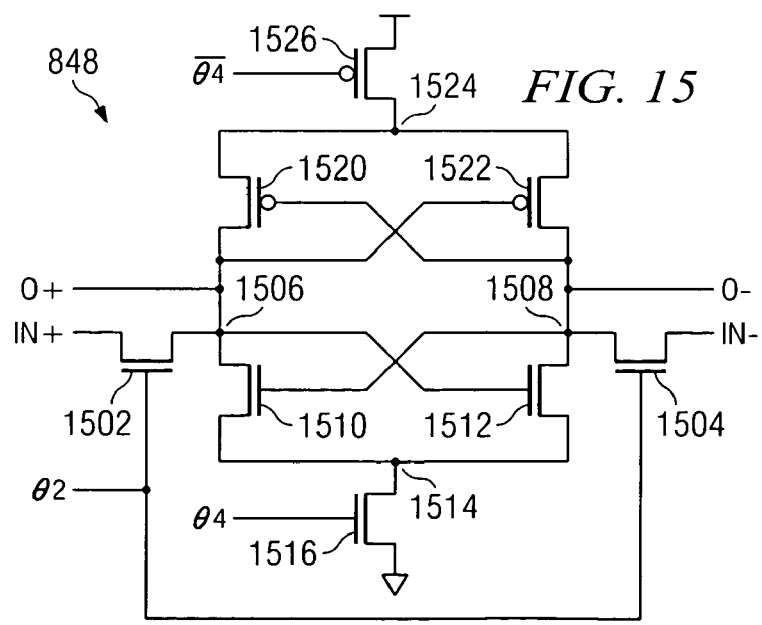
FIG. 15 illustrates a schematic diagram for the dynamic latch.

Referring now to FIG. 15, there is illustrated a schematic diagram of the dynamic latch 848. There are provided two n-channel gate transistors 1502 and 1504 for connecting the positive and negative inputs associated therewith to respective nodes 1506 and 1508, the gates of transistors 1502 and 1504 gated by the Φ2 clock signal. Two common source n-channel transistors 1510 and 1512 have the sources thereof connected to a common source node 1514 and the drains thereof connected respectively to nodes 1506 and 1508. An n-channel transistor 1516 is connected between node 1514 and ground and controlled by the Φ4 clock signal. Therefore, the sources of transistors 1510 and 1512 will be connected to ground when Φ4 is a logic "high." Node 1506 is associated with a positive output and node 1508 is associated with a negative output. Two cross-coupled p-channel transistors 1520 and 1522 are provided, transistor 1520 connected between a node 1524 and node 1506 and transistor 1522 connected between node 1524 and node 1508. The gate of transistor 1520 is connected to node 1508 and the gate of transistor 1522 is connected to node 1506. A p-channel gate transistor 1526 is provided for connection between $V_{DD}$ and node 1524 and the gate thereof connected to the clock signal Φ4-Bar. Thus, when transistor 1526 is turned on, node 1524 is connected to $V_{DD}$.

In operation, when the clock signal Φ2 goes high, the differential output of the reconfigurable latch is connected to nodes 1506 and 1508. However, this latch is essentially powered down until the evaluation phase is complete and Φ4 goes high at an edge 914, the same time that Φ2 goes low at a negative falling edge 916. Thus, the output of the reconfigurable latch which is provided at the falling edge of Φ3, falling edge 912, will be disposed on nodes 1506, and 1508 while the latch 848 is powered down. When transistors 1502 and 1504 are turned off, then the voltage on nodes 1506 and 1508 is "latched" into the latch 848 by turning on transistors 1516 and 1526. This provides an output to the transmit latch 846.

Although the preferred embodiment has been described in detail, it should be understood that various changes, substitutions and alterations can be made therein without departing from the scope of the invention as defined by the appended claims.

What is claimed is:

1. A differential analog-to-digital data converter (ADC) for receiving a positive input signal and a negative input signal, comprising:
 a plurality of comparators each associated with a resolution bit of the data converter, one of the inputs of each of said comparators interfaced to a first analog input voltage and the other input of each of the comparators interfaced with a respective reference voltage;
 a resolution bit reference device for generating a plurality of successively increasing voltages at respective reference nodes from a first voltage to a second voltage, each of said reference nodes connected to a respective one of the other inputs of said comparators to provide the respective reference voltage, and the voltage difference between said reference nodes defining the resolution of the data converter;

wherein for a substantially a zero difference between the positive and negative input signals, the voltage level of said first analog input voltage is disposed at a voltage above the voltage level on one of said reference nodes and below the voltage level on the next higher one of said reference nodes to constitute the zero code for the data converter; and a resolution varying device to vary the voltages between said respective nodes in a manner such that the zero code does not substantially vary.

2. The ADC of claim 1, wherein the voltage difference between each of said reference nodes is substantially the same voltage.

3. The ADC of claim 1, wherein said first analog input voltage comprises one of the positive and negative input signals.

4. The ADC of claim 3, wherein the voltages on said reference nodes are referenced to the other of the positive and negative input signals.

5. The ADC of claim 1, wherein said resolution bit difference device comprises:
    a plurality of series connected resistive devices wherein each of the junctions between said resistive devices comprises one of said respective reference nodes; and
    a driver for driving current through said resistive devices.

6. The ADC of claim 5, wherein said driver comprises a current source having defined current driven through said resistive devices.

7. The ADC of claim 6, wherein the bit resolution of the ADC is greater than the number of said reference nodes.

8. The ADC of claim 7, wherein said first analog input voltage comprises one of the positive and negative input signals and the other of said positive and negative signals is coupled to the one of the reference nodes.

9. The ADC of claim 8, wherein said resolution varying device comprises a current varying device for varying the current through said current source.

10. A differential analog-to-digital data converter (ADC) for receiving a positive input signal and a negative input signal, comprising:
    a distributed resistive device having taps associated therewith;
    a plurality of comparators each having a signal input connected to one of the positive and negative input signals and a reference input connected to a tap on said distributed resistive device;
    a driver for driving current through said distributed resistive device with one of the taps of said distributed resistive device disposed at substantially the other of said positive and negative input signals; and
    a current varying device for varying the current through said distributed resistive device to vary the voltage between taps and maintain the zero code unvarying.

11. The ADC of claim 10, wherein the voltage difference between adjacent ones of said taps is substantially the same voltage.

12. The ADC of claim 10, wherein said driver comprises:
    a buffer circuit having the input thereof connected to the other of said positive and negative input signals and the output thereof connected to the one of the taps of said distributed resistive device; and
    a current source for driving a known current through said distributed resistance device.

13. The ADC of claim 12, wherein said distributed resistive device comprises a plurality of series connected resistors connected between a first node and a second node and said current source driving current between said first and second nodes, the junctions between said series connected resistors comprising said taps connected to the reference inputs of respective ones of said comparators.

14. The ADC of claim 13, wherein the ADC has a finite resolution defined by the voltage across said resistors that comprises the size of the least significant bit (LSB) of the ADC, and the full number of bits of the ADC greater than the number of said series connected resistors.

15. The ADC of claim 14, wherein said current varying device is operable to vary the current through said current source, and thus vary the size of the LSB.

16. The ADC of claim 12, wherein said current source is variable and said current varying device is operable to vary current provided by said current source.

17. The ACD of claim 16, wherein said current source is referred to a stable fixed current source and said current varying device is operable vary the current through said distributed resistive device in a ratiometric manner.

* * * * *